United States Patent
Narazaki

(10) Patent No.: US 12,482,696 B2
(45) Date of Patent: Nov. 25, 2025

(54) SAMPLE HOLDER

(71) Applicant: KYOCERA Corporation, Kyoto (JP)

(72) Inventor: Yoshinori Narazaki, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 522 days.

(21) Appl. No.: 18/004,894

(22) PCT Filed: Jul. 6, 2021

(86) PCT No.: PCT/JP2021/025470
§ 371 (c)(1),
(2) Date: Jan. 10, 2023

(87) PCT Pub. No.: WO2022/014410
PCT Pub. Date: Jan. 20, 2022

(65) Prior Publication Data
US 2023/0245918 A1    Aug. 3, 2023

(30) Foreign Application Priority Data

Jul. 13, 2020  (JP) ................. 2020-120020
Oct. 15, 2020  (JP) ................. 2020-174081

(51) Int. Cl.
| | |
|---|---|
| *C04B 35/581* | (2006.01) |
| *C23C 14/50* | (2006.01) |
| *C23C 16/458* | (2006.01) |
| *H01L 21/683* | (2006.01) |
| *H01L 21/687* | (2006.01) |

(52) U.S. Cl.
CPC ...... *H01L 21/68757* (2013.01); *C04B 35/581* (2013.01); *C23C 14/50* (2013.01); *C23C 16/4581* (2013.01); *H01L 21/6833* (2013.01)

(58) Field of Classification Search
CPC .......... H01L 21/68757; H01L 21/6833; H01L 21/67103; H01L 21/683; H01L 21/6831; C04B 35/581; C04B 2235/3217; C04B 2235/3232; C04B 2235/6565; C04B 2235/80; C04B 2235/85; C23C 14/50; C23C 16/4581; H02N 13/00
See application file for complete search history.

(56) References Cited

U.S. PATENT DOCUMENTS

| | | |
|---|---|---|
| 5,393,715 A | 2/1995 | Nakahata et al. |
| 11,396,704 B2 | 7/2022 | Fujisato et al. |
| 2020/0207666 A1 | 7/2020 | Wang et al. |

FOREIGN PATENT DOCUMENTS

| | | |
|---|---|---|
| JP | 06-128041 A | 5/1994 |
| JP | 09-110405 A | 4/1997 |

(Continued)

OTHER PUBLICATIONS

English text of JP-2008044846-A (Year: 2008).*
English text of JP-5972630-B2 (Year: 2016).*

*Primary Examiner* — Christopher A Fiorilla
(74) *Attorney, Agent, or Firm* — Volpe Koenig

(57) ABSTRACT

A sample holder of the present disclosure includes an aluminum nitride substrate and an internal electrode provided on the aluminum nitride substrate. The aluminum nitride substrate includes a plurality of aluminum nitride particles and aluminum oxynitride particles located in crystal grain boundaries of the plurality of aluminum nitride particles. Titanium is solid-solved in the aluminum oxynitride particles.

8 Claims, 4 Drawing Sheets

(56) References Cited

FOREIGN PATENT DOCUMENTS

| JP | 11-317441 | A | | 11/1999 | | |
|---|---|---|---|---|---|---|
| JP | 11-335173 | A | | 12/1999 | | |
| JP | 2008044846 | A | * | 2/2008 | | |
| JP | 5972630 | B2 | * | 8/2016 | ........... | C04B 35/645 |
| JP | 2020-088195 | A | | 6/2020 | | |

* cited by examiner

SAMPLE HOLDER

TECHNICAL FIELD

This application is national stage application of International Application No. PCT/JP2021/025470, filed on Jul. 6, 2021, which designates the United States, incorporated herein by reference, and which claims the benefit of priority from Japanese Patent Application No. 2020-120020, filed on Jul. 13, 2020 and Japanese Patent Application No. 2020-174081, filed on Oct. 15, 2020, the entire contents of which are incorporated herein by reference.

The present disclosure relates to a sample holder.

BACKGROUND OF INVENTION

In the related art, for example, aluminum nitride sintered bodies disclosed in JP 6-128041 A, JP 11-335173 A, and JP 2020-88195 A, have been known.

SUMMARY

A sample holder of the present disclosure includes: an aluminum nitride substrate including a plurality of aluminum nitride particles and aluminum oxynitride particles located at crystal grain boundaries between the plurality of aluminum nitride particles; and an internal electrode provided on the aluminum nitride substrate. Titanium is solid-solved in the aluminum oxynitride particle.

DESCRIPTION OF EMBODIMENTS

Hereinafter, an example of a sample holder 10 of the present disclosure will be described in detail with reference to the drawings.

Figure 1:
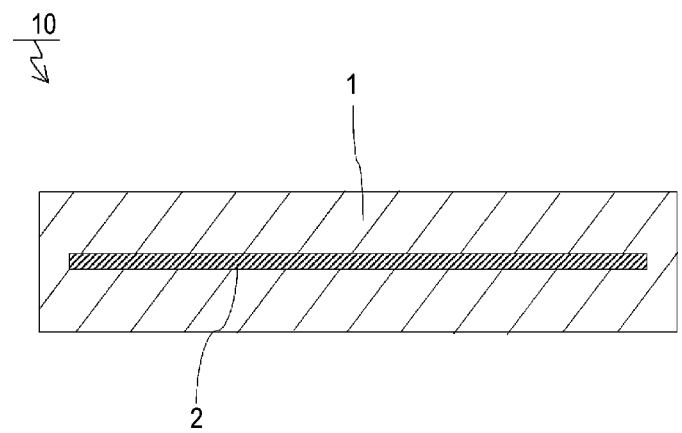
FIG. 1 is a longitudinal sectional view illustrating a sample holder of the present disclosure.

The sample holder 10 illustrated in FIG. 1 includes: an aluminum nitride substrate 1 including aluminum nitride particles 11 and aluminum oxynitride particles 12; and an internal electrode 2 provided on the aluminum nitride substrate 1. The "particle" in the present disclosure indicates a crystal grain having a continuous atomic arrangement.

The aluminum nitride substrate 1 is a member for holding a sample. The aluminum nitride substrate 1 may be, for example, a plate-like member, a disc-like member, or a rectangular plate-like member. When the aluminum nitride substrate 1 has, for example, a plate shape, one main surface may be a wafer placement surface. The dimensions of the aluminum nitride substrate 1 can be, for example, 200 to 500 mm in diameter and 1 to 15 mm in thickness when the aluminum nitride substrate 1 has a disc shape.

The aluminum nitride substrate 1 includes a plurality of aluminum nitride particles 11 and aluminum oxynitride particles 12. Here, the aluminum nitride particles 11 are particles made of aluminum nitride, but may include impurities other than aluminum nitride, or lattice defects. The aluminum oxynitride particles 12 are particles made of aluminum oxynitride (AlON), but may include impurities other than aluminum oxynitride, or lattice defects. In the aluminum nitride substrate 1, the aluminum nitride particles 11 may have an abundance ratio of about 95%, and the aluminum oxynitride may have an abundance ratio of about 5% in the following case, for example: the abundance ratio of aluminum nitride and aluminum oxynitride is analyzed by, X-ray diffraction (XRD) using CuKα rays as an X-ray source; aluminum nitride has a peak of a (100) plane appearing in the vicinity of $2\theta=33.2°$, and aluminum oxynitride has a main peak of a (101) plane appearing in the vicinity of $2\theta=33.8°$ with 27R aluminum oxynitride being used as an example of aluminum oxynitride; the intensities of the peaks are compared.

The aluminum nitride substrate 1 has an internal electrode 2 on the surface or inside thereof. When the sample holder 10 is used as an electrostatic chuck, the internal electrode 2 may be an electrostatic adsorption electrode. At this time, the material of the internal electrode 2 may be a metal such as platinum or tungsten. The dimensions of the internal electrode 2 can be, for example, 0.01 mm to 0.5 mm in thickness and 30000 $mm^2$ to 190000 $mm^2$ in area. The internal electrode 2 may be a heating resistor. If so, the internal electrode 2 may contain: a metal component such as silver palladium; and a glass component having an oxide of a material such as silicon, bismuth, calcium, aluminum, or boron. At this time, the dimensions of the internal electrode 2 can be, for example, 0.01 mm to 0.1 mm in thickness, 0.5 mm to 5 mm in width, and 1000 mm to 50000 mm in length. The aluminum nitride substrate 1 may have a plurality of internal electrodes 2. The aluminum nitride substrate 1 may include both an electrostatic adsorption electrode and a heater electrode 3.

The aluminum nitride substrate 1 of the present disclosure includes aluminum nitride particles 11 and aluminum oxynitride particles 12, and titanium 13 is solid-solved in the aluminum oxynitride particles 12. That is, the sample holder 10 of the present disclosure includes: an aluminum nitride substrate 1 including a plurality of aluminum nitride particles 11 and aluminum oxynitride particles 12 located at crystal grain boundaries between the plurality of aluminum nitride particles 11; and an internal electrode 2 provided on the aluminum nitride substrate 1. Titanium 13 is solid-solved in the aluminum oxynitride particle 12. As a result, the volume resistivity of the aluminum nitride substrate 1 can be increased. The reason will be described below.

First, in the aluminum oxynitride particles 12 in which titanium 13 is solid-solved, defects of the titanium 13 are electrically positive as compared with normal aluminum oxynitride particles 12. This is because the aluminum of the aluminum oxynitride particles 12 is replaced with the titanium 13, so that one electron is insufficient. The aluminum nitride particles 11 have aluminum vacancies, and the aluminum vacancies are electrically negative. In this way, the titanium defects of the aluminum oxynitride particles 12 and the aluminum vacancies of the aluminum nitride particles 11 have opposite charges. Therefore, the aluminum oxynitride particle 12 in which the titanium 13 is solid-solved can electrostatically pin the aluminum vacancies present in the vicinity of the grain boundaries in the aluminum nitride particles 11. As a result, the volume resistivity of the aluminum nitride substrate 1 can be increased as compared with a case where the titanium 13 is not solid-solved in the aluminum oxynitride particles 12.

Figure 2:
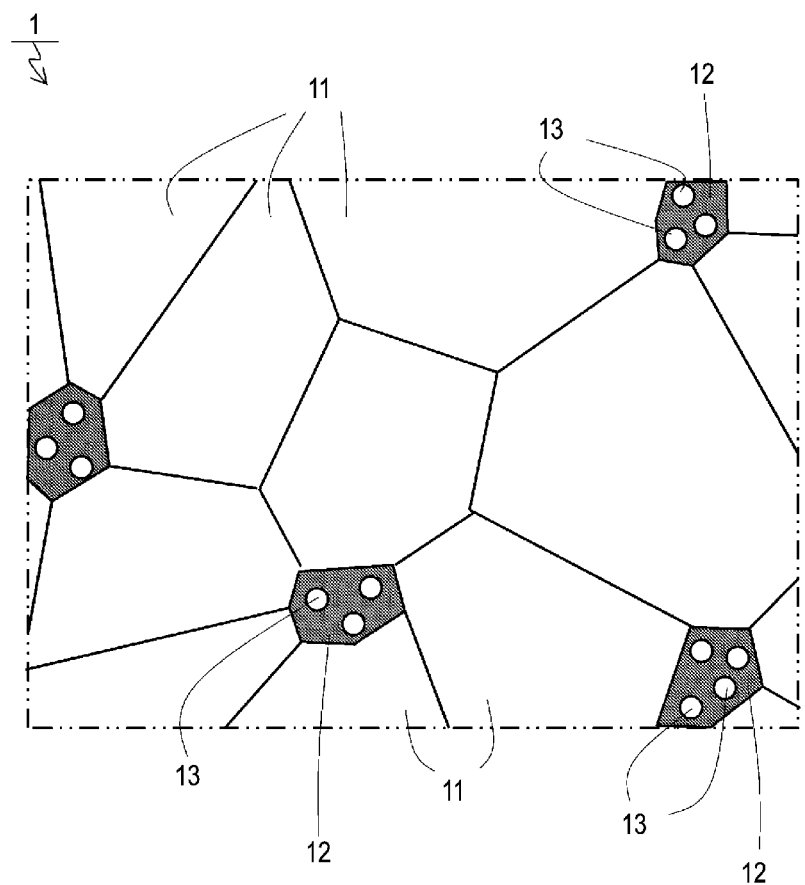
FIG. 2 is a schematic view illustrating titanium that is solid-solved in aluminum nitride particles, aluminum oxynitride particles, and aluminum oxynitride particles in an aluminum nitride substrate of the sample holder illustrated in FIG. 1.

FIG. 2 schematically illustrates an example of the presence form of the aluminum oxynitride particles 12 and the aluminum nitride particles 11 in the substrate. In FIG. 2, hatched regions are the aluminum oxynitride particles 12, and other regions are the aluminum nitride particles 11. Regions having a circle shape present in the aluminum oxynitride particles 12 is the titanium 13.

As illustrated in FIG. 2, the aluminum nitride substrate 1 of the present disclosure includes the aluminum nitride particles 11 and the aluminum oxynitride particles 12, and the titanium 13 is solid-solved in the aluminum oxynitride particles 12. The titanium 13 may be divided into a plurality of regions and solid-solved in the aluminum oxynitride particles 12. The aluminum nitride substrate 1 may have aluminum oxynitride particles 12 in which the titanium 13 is not solid-solved. The titanium 13 may be present at a grain boundary between the aluminum nitride particle 11 and the aluminum oxynitride particle 12. The titanium 13 may be present at a grain boundary between the aluminum nitride particles 11. The titanium 13 may be present at a grain boundary between the aluminum oxynitride particles 12.

Figure 3:
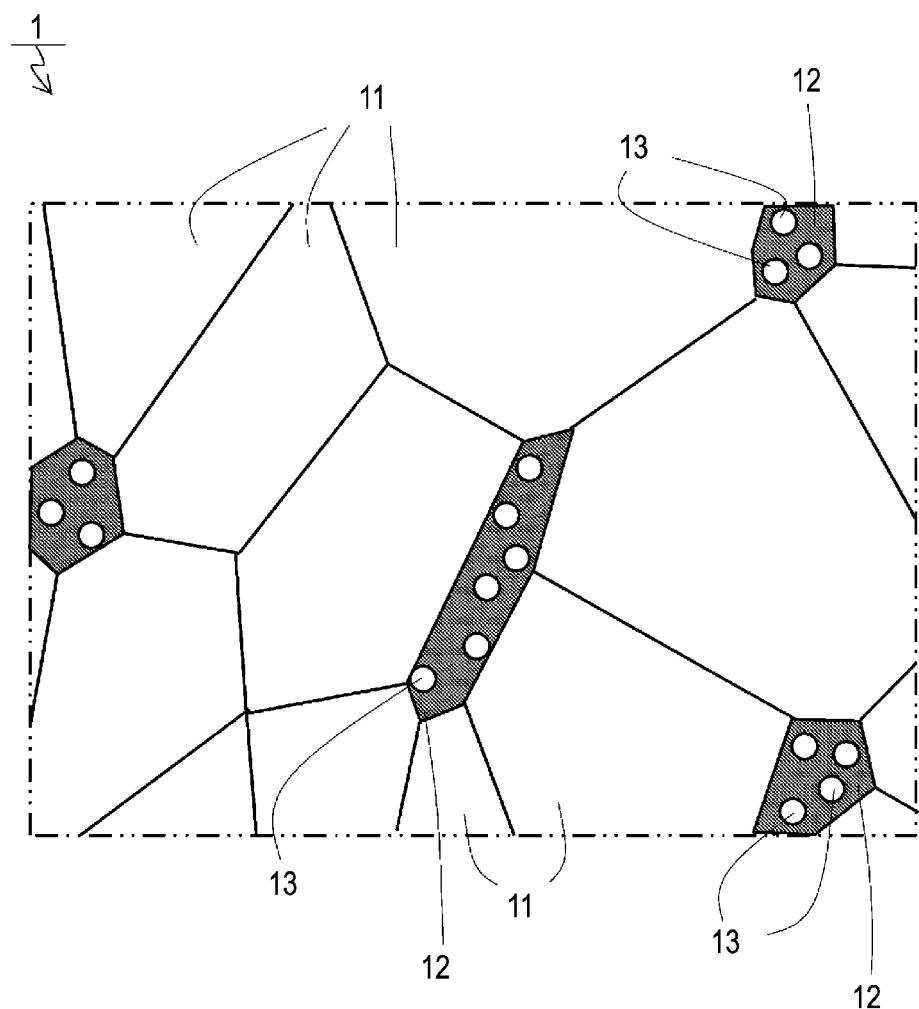
FIG. 3 is a schematic view illustrating titanium that is solid-solved in aluminum nitride particles, aluminum oxynitride particles, and aluminum oxynitride particles in an aluminum nitride substrate of a sample holder of another example.

As illustrated in FIG. 3, the aluminum oxynitride particle 12 may have an elongated shape. In the aluminum nitride substrate 1, the presence region of the aluminum oxynitride particle 12 may be elongated. In this case, since the aluminum oxynitride particles 12 in which titanium 13 is solid-solved are present in a wide range of the grain boundaries, the aluminum oxynitride particles 12 in which titanium 13 is present can electrostatically pin more aluminum vacancies present at the grain boundaries of the aluminum nitride particles 11. As a result, the volume resistivity of the aluminum nitride substrate 1 can be further increased.

It can be confirmed by structural analysis by the following method that the aluminum nitride substrate 1 includes the aluminum nitride particles 11 and the aluminum oxynitride particles 12, and the titanium 13 is solid-solved in the aluminum oxynitride particles 12. First, a predetermined portion of the aluminum nitride substrate 1 is taken out by a known method such as machining, cutting, and polishing. Next, the portion taken out is sliced by a known method such as an argon ion milling method to obtain a sample. Then, the sample is structurally analyzed by a known method such as transmission electron microscopy (TEM), electron diffraction, energy dispersive X-ray spectroscopy (EDS), electron energy-loss spectroscopy (EELS), mapping analysis, or X-ray diffraction (XRD) to specify aluminum oxynitride in the sintered body and oxygen contained in the aluminum oxynitride at the same time. Next, the titanium 13 in the sintered body is specified by the above method or a method such as time-of-flight secondary ion mass spectrometry (TOF-SIMS). When the distributions of oxygen and the titanium 13 overlap, the titanium 13 can be solid-solved in the aluminum oxynitride particles 12.

The aluminum oxynitride particles 12 may be present around the internal electrode 2. As a result, the aluminum vacancies around the internal electrode 2 can be pinned, so that the transfer of charges from aluminum nitride to the internal electrode 2 can be suppressed when a voltage is applied. As a result, the volume resistivity of the aluminum nitride substrate 1 can be further increased. For example, the aluminum oxynitride particles 12 may be located at a position of 0.01 to 1.5 mm from the surface of the internal electrode 2.

The aluminum oxynitride particles 12 may be in contact with the internal electrode 2. Therefore, charge compensation can be performed by pinning the charge moving from the aluminum nitride substrate 1 toward the electrode when the voltage is applied. This can increase the volume resistivity of the portion in contact with the internal electrode 2. As a result, the detachability of the sample can be further enhanced.

The aluminum oxynitride particles 12 may be present more on an internal electrode 2 side of the sample holder 1 than on a wafer placement surface side of the sample holder 1. This can increase the pinning effect of the region on the internal electrode 2 side than the region on the wafer placement surface side. Therefore, when power is supplied to the electrode, the movement of the charge becomes sharp, and the response speed can be increased. As a result, the polarization after the application of the voltage to the electrostatic adsorption electrode of the sample holder 1 is stopped can be reduced, and the sample can be easily desorbed.

The "wafer placement surface side" as used herein means a region of 0.01 to 1.5 mm from the wafer placement surface. The "internal electrode 2 side" as used herein means a region 0.01 to 1.5 mm from the internal electrode 2. The presence of more aluminum oxynitride particles 12 on the internal electrode 2 side than on the wafer placement surface side can be confirmed, for example, by detecting the places of presence of oxygen on the wafer placement surface side and the internal electrode 2 side of the sample holder 1 using wavelength dispersive X-ray spectroscopy (WDS) or X-ray photoelectron spectroscopy (XPS) as an analyzer.

Figure 4:
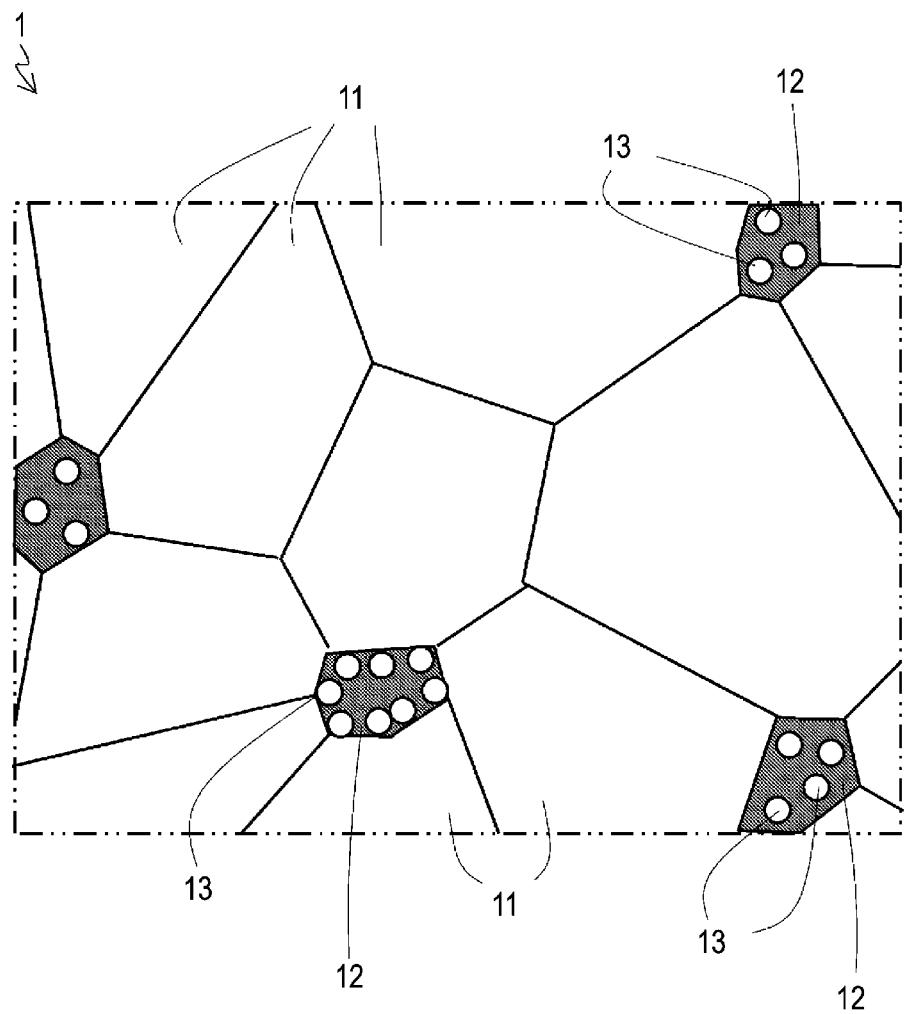
FIG. 4 is a schematic view illustrating titanium that is solid-solved in aluminum nitride particles, aluminum oxynitride particles, and aluminum oxynitride particles in an aluminum nitride substrate of a sample holder of another example.

As illustrated in FIG. 4, the aluminum oxynitride particle 12 may have a site where titanium is segregated in a portion in contact with the aluminum nitride particle 11. This can make more efficiently electrostatic pinning of the aluminum vacancies present in the vicinity of the grain boundaries in the aluminum nitride particles 11. As a result, the volume resistivity of the aluminum nitride substrate 1 can be more increased.

Figure 5:
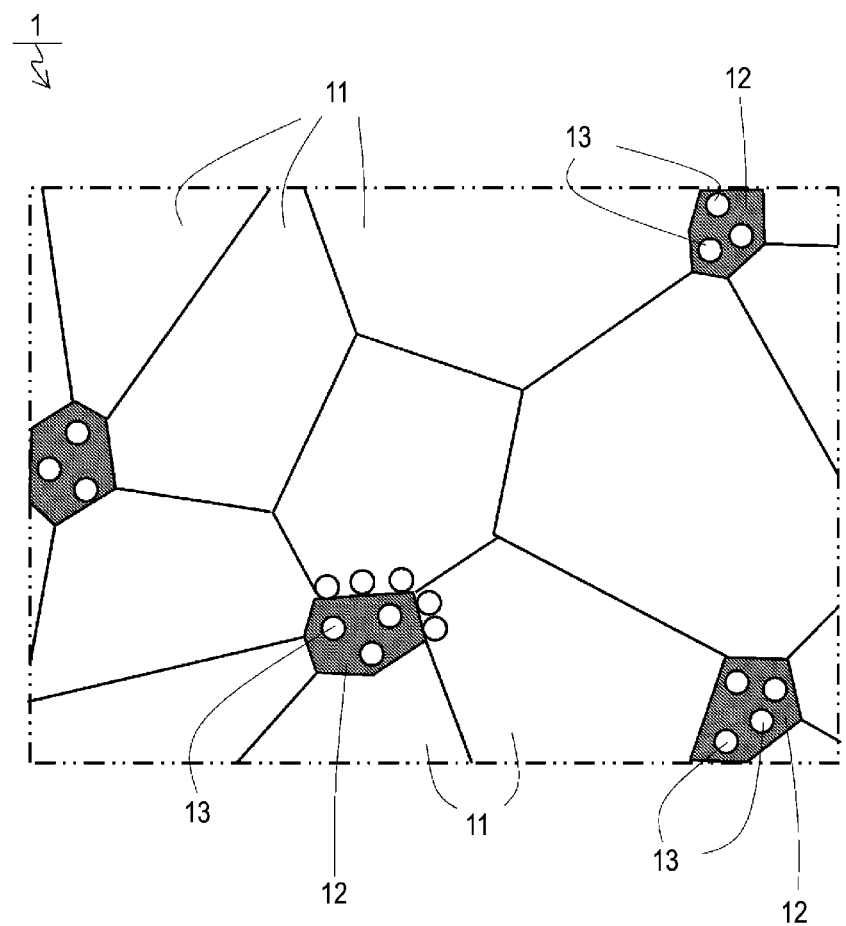
FIG. 5 is a schematic view illustrating titanium that is solid-solved in aluminum nitride particles, aluminum oxynitride particles, and aluminum oxynitride particles in an aluminum nitride substrate of a sample holder of another example.

As illustrated in FIG. 5, the aluminum nitride particles 11 may have a portion where the titanium 13 is segregated into a portion that is in contact with the aluminum oxynitride particles 12. As a result, the titanium defects in the aluminum nitride particles 11 can electrostatically pin the aluminum vacancies. As a result, the volume resistivity of the aluminum nitride substrate 1 can be more increased.

The internal electrode 2 may also include aluminum nitride. This enables mutual charge compensation between the aluminum nitride included in the internal electrode 2 and the aluminum nitride particles 11 on the wafer holding surface side and the opposite side sandwiching the internal electrode 2. Therefore, the charge bias can be reduced inside the sample holder 10.

Figure 6:
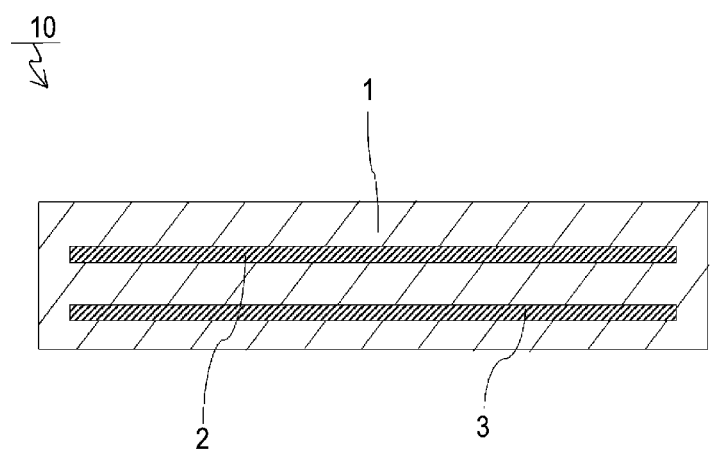
FIG. 6 is a longitudinal sectional view illustrating a sample holder of another example.

As illustrated in FIG. 6, the internal electrode 2 is an electrostatic adsorption electrode, and the aluminum nitride substrate 1 further includes a heater electrode 3, and further includes, around the heater electrode 3, the aluminum oxynitride particles 12 in which the titanium 13 is solid-solved. This can enhance the pinning effect of the portion where the temperature increases and the generation of charges from the aluminum nitride particles 11 increases. As a result, the volume resistivity of the aluminum nitride substrate 1 can be further increased. For example, the aluminum oxynitride particles 12 may be at a position 0.01 to 1.5 mm from the surface of the heater electrode 3. The aluminum oxynitride particles 12 may be in contact with the heater electrode 3.

Hereinafter, a method for producing the aluminum nitride substrate 1 used in the sample holder 10 of the present disclosure will be described. First, an aluminum nitride powder, an aluminum oxide powder, a titanium oxide powder, and a substance capable of generating carbon during firing, such as a binder, are mixed and molded into a predetermined shape. Next, a molded body is fired at 2000° C. or higher and cooled to 100° C. At this time, for example, subcooling can be performed by setting the cooling rate to 3.5 to 5.0° C. per minute. At this time, 27R aluminum oxynitride including solid-solved titanium 13, which is not generated without subcooling, is precipitated in the aluminum nitride sintered body. This can produce the aluminum nitride substrate 1 including the aluminum oxynitride particles 12 in which titanium 13 is solid-solved. A sample 1 containing the aluminum oxynitride particles 12 in which the titanium 13 was solid-solved was prepared by the above producing method.

In addition, a sample 2 containing the aluminum oxynitride particles 12 in which the titanium 13 was not solid-solved was prepared by a normal method in which subcooling was not performed. Each volume resistivity was evaluated by the following method. First, a sample having a length of 50 to 60 mm, a width of 50 to 60 mm, and a thickness of 0.5 to 2 mm was cut out from the aluminum nitride sintered body, washed with acid and alkali, and dried. Next, a main electrode, a ring electrode, and a counter electrode were printed and baked on this sample, and the volume resistivity was measured using a three-terminal method (JIS C 2141:1992). The results are shown in Table 1.

TABLE 1

| Sample | Cooling rate [° C./min] | Solid solution of titanium atoms to AlON particles | Volume resistivity value [Ωcm] |
|---|---|---|---|
| 1 | 3.5 to 5.0 | Yes | $5.0 \times 10^9$ |
| 2 | 0.5 to 2.0 | No | $5.0 \times 10^8$ |

As shown in Table 1, the sample 2 containing no aluminum oxynitride particles 12 in which titanium 13 is solid-solved has a volume resistance value of $5 \times 10^8$ Ωcm at 400° C. In contrast, the sample 1 containing the aluminum oxynitride particles 12 in which titanium 13 is solid-solved has a volume resistance value of $5 \times 10^9$ Ωcm at 400° C. In this way, including the aluminum oxynitride particles 12 in which the titanium 13 is solid-solved can increase the volume resistivity of the aluminum nitride substrate 1 used for the sample holder 10. Using such an aluminum nitride substrate 1 as the sample holder 10 can eliminate the polarization after the voltage application to the electrostatic adsorption electrode is stopped, and enables easy detachment of the wafer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A sample holder comprising:
   an aluminum nitride substrate comprising a plurality of aluminum nitride particles and aluminum oxynitride particles located at crystal grain boundaries between the plurality of aluminum nitride particles; and
   an internal electrode provided in the aluminum nitride substrate,
   wherein titanium is solid-solved in the aluminum oxynitride particles.

2. The sample holder according to claim 1,
   wherein the aluminum oxynitride particles are located proximate to the internal electrode.

3. The sample holder according to claim 2,
   wherein the aluminum oxynitride particles are in contact with the internal electrode.

4. The sample holder according to claim 1,
   wherein the aluminum oxynitride particles are present more on an internal electrode side of the sample holder than a wafer placement surface side of the sample holder.

5. The sample holder according to claim 1,
   wherein the aluminum oxynitride particles have a portion where the titanium is segregated into a portion that is in contact with one or more aluminum nitride particles of the plurality of aluminum nitride particles.

6. The sample holder according to claim 1,
   wherein one or more aluminum nitride particles of the plurality of aluminum nitride particles have a portion where the titanium is segregated into a portion that is in contact with the aluminum oxynitride particles.

7. The sample holder according to claim 1,
   wherein the internal electrode contains aluminum nitride.

8. The sample holder according to claim 1,
   wherein the internal electrode is an electrostatic adsorption electrode, and
   the aluminum nitride substrate further comprises a heater electrode, and further comprises, around the heater electrode, aluminum oxynitride particles in which titanium is solid-solved.

* * * * *